(12) United States Patent
Biber et al.

(10) Patent No.: US 10,488,478 B2
(45) Date of Patent: Nov. 26, 2019

(54) METHOD, SYSTEM AND MAGNETIC RESONANCE APPARATUS FOR COMPENSATING FOR INHOMOGENEITIES IN THE MAGNETIC FIELD

(71) Applicants: Stephan Biber, Erlangen (DE); Daniel Driemel, Oederan (DE); Katharina Hesels, Erlangen (DE); Ralf Ladeback, Erlangen (DE); Jörg Rothard, Litzendorf (DE)

(72) Inventors: Stephan Biber, Erlangen (DE); Daniel Driemel, Oederan (DE); Katharina Hesels, Erlangen (DE); Ralf Ladeback, Erlangen (DE); Jörg Rothard, Litzendorf (DE)

(73) Assignee: Siemens Aktiengesellschaft, München (DE)

( * ) Notice: Subject to any disclaimer, the term of this patent is extended or adjusted under 35 U.S.C. 154(b) by 876 days.

(21) Appl. No.: 14/687,378

(22) Filed: Apr. 15, 2015

(65) Prior Publication Data

US 2015/0301135 A1 Oct. 22, 2015

(30) Foreign Application Priority Data

Apr. 16, 2014 (DE) ........................ 10 2014 207 314

(51) Int. Cl.
*G01R 33/3875* (2006.01)
*G01R 33/36* (2006.01)
(Continued)

(52) U.S. Cl.
CPC .... *G01R 33/3875* (2013.01); *G01R 33/34046* (2013.01)

(58) Field of Classification Search
CPC .................... G01R 33/3875; G01R 33/34046
See application file for complete search history.

(56) References Cited

U.S. PATENT DOCUMENTS 5,173,661 A 12/1992 Knuttel et al.
6,181,137 B1 * 1/2001 Havens ................ G01R 33/387
324/319
(Continued)

FOREIGN PATENT DOCUMENTS

CN 101427146 A 5/2009
CN 102830377 A 12/2012
(Continued)

OTHER PUBLICATIONS

Korean Office Action for related Korean Application No. 10-2015-0053037 dated Feb. 28, 2017.
(Continued)

*Primary Examiner* — Dixomara Vargas
*Assistant Examiner* — Zannatul Ferdous
(74) *Attorney, Agent, or Firm* — Lempia Summerfield Katz LLC

(57) ABSTRACT

A method and a magnetic resonance apparatus compensate for inhomogeneities in a magnetic field generated by the magnetic resonance apparatus with a shim coil of the magnetic resonance apparatus. The shim coil is arranged at an object under investigation. A position and an orientation of the shim coil are automatically determined. The inhomogeneities of the magnetic field are determined. The inhomogeneities are compensated for via the shim coil depending on the position and the orientation of the shim coil.

18 Claims, 2 Drawing Sheets

(51) Int. Cl.
*G01V 3/00* (2006.01)
*G01R 33/34* (2006.01)

(56) References Cited

U.S. PATENT DOCUMENTS

| | | | |
|---|---|---|---|
| 6,529,005 B1* | 3/2003 | Kasten | G01R 33/3873 |
| | | | 324/319 |
| 7,123,012 B2* | 10/2006 | Srinivasan | G01R 33/34046 |
| | | | 324/318 |
| 7,348,775 B2* | 3/2008 | Weiger | G01R 33/3875 |
| | | | 324/307 |
| 2001/0048306 A1 | 12/2001 | Mueller et al. | |
| 2004/0183536 A1* | 9/2004 | Huang | G01R 33/3873 |
| | | | 324/320 |
| 2008/0164878 A1* | 7/2008 | Morich | G01R 33/3875 |
| | | | 324/320 |
| 2009/0131781 A1 | 5/2009 | Dahnke et al. | |
| 2009/0147940 A1* | 6/2009 | Graves | H04M 3/42365 |
| | | | 379/208.01 |
| 2010/0237867 A1* | 9/2010 | Slade | G01R 33/3873 |
| | | | 324/314 |
| 2011/0221441 A1 | 9/2011 | Baumgartl et al. | |
| 2012/0217967 A1* | 8/2012 | Tsujita | G01R 33/3875 |
| | | | 324/322 |
| 2012/0323113 A1 | 12/2012 | Biber | |
| 2013/0134978 A1 | 5/2013 | Biber | |
| 2013/0193968 A1 | 8/2013 | Biber | |
| 2015/0022203 A1* | 1/2015 | Gumbrecht | G01R 33/5659 |
| | | | 324/309 |
| 2016/0252594 A1 | 9/2016 | Biber | |

FOREIGN PATENT DOCUMENTS

| | | |
|---|---|---|
| CN | 103135081 A | 6/2013 |
| DE | 3937150 A1 | 5/1991 |
| DE | 69409833 T2 | 9/1998 |
| DE | 102010010820 A1 | 9/2011 |
| DE | 102011077724 A1 | 12/2012 |
| DE | 102011080275 A1 | 2/2013 |
| DE | 102013214125 A1 | 4/2014 |
| JP | H05176910 A | 7/1993 |
| JP | 2001187042 A | 7/2001 |
| JP | 2001218750 A | 8/2001 |
| JP | 2008272451 A | 11/2008 |
| WO | WO9429741 A1 | 12/1994 |

OTHER PUBLICATIONS

Chinese Office Action for related Chinese Application No. 201510173911.9 dated Aug. 11, 2017.
Korean office Action for related Korean Application No. 10-2015-0053037 dated May 17, 2016, with English Translation.
German Office action for related German Application No. 10 2014 207 314.6, dated Nov. 28, 2014, with English Translation.

* cited by examiner

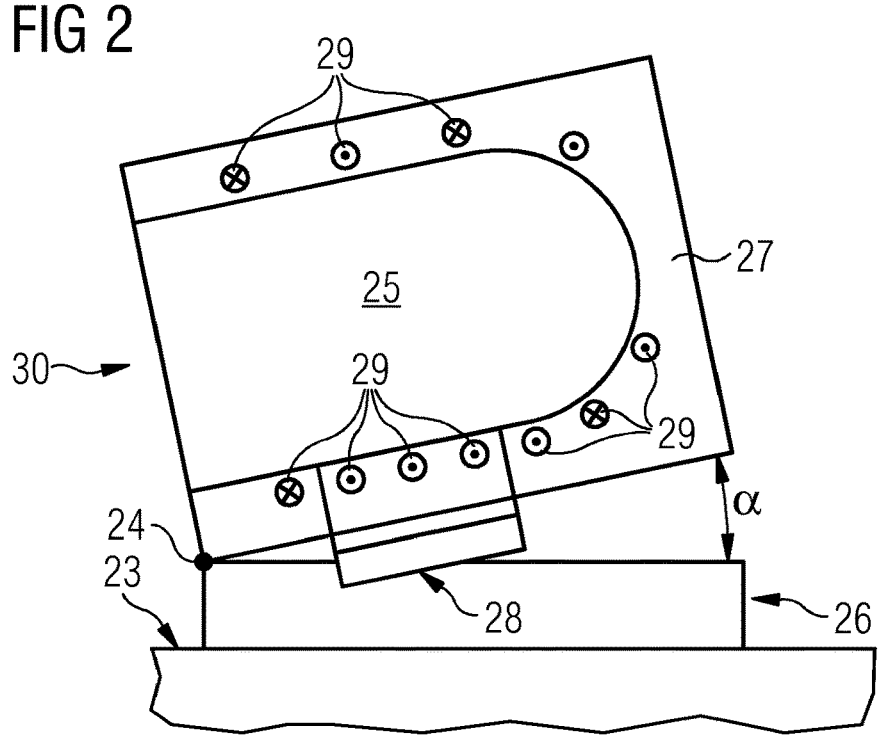
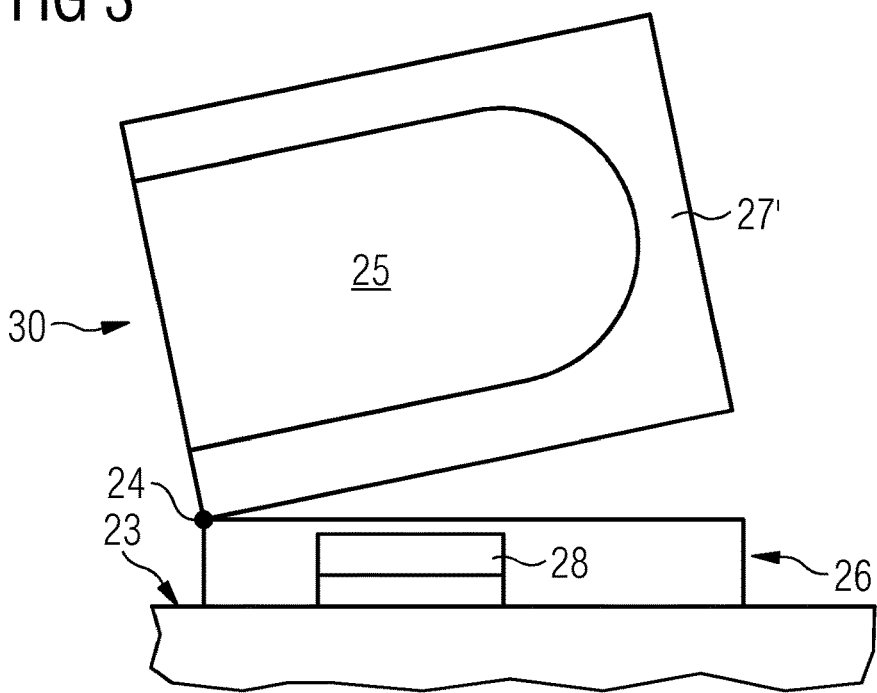

METHOD, SYSTEM AND MAGNETIC RESONANCE APPARATUS FOR COMPENSATING FOR INHOMOGENEITIES IN THE MAGNETIC FIELD

This application claims the benefit of DE 102014207314.6, filed on Apr. 16, 2014, which is hereby incorporated by reference in its entirety.

FIELD

The disclosed embodiments relate to a method, a system and a magnetic resonance apparatus to compensate for inhomogeneities in a magnetic field generated by the magnetic resonance apparatus.

BACKGROUND

The following options are used for compensating for inhomogeneities in the magnetic field. Shim sheets made of ferromagnetic material are installed at suitable sites, which is known as passive shimming. Gradient offsets (corresponding to linear shim terms) are used. Global shim coils are built immovably into the region of the gradient coils. Local shim coils are positioned close to the object under investigation. With the local shim coils close to the object under investigation, strongly localized inhomogeneities of the $B_0$ field in the region of 0 to 10 ppm may be compensated for. Even field distortions caused by the patient with his/her residual susceptibility may be compensated for with the local shim coil. In addition, remaining inhomogeneities of the magnet that cannot be compensated for by passive shimming and the gradient offset may be compensated for with the local shim coil.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the disclosed embodiments may improve the compensation of inhomogeneities of the magnetic field with local shim coils.

According to one aspect, a method compensates for inhomogeneities in a magnetic field generated by a magnetic resonance apparatus. According to other aspects, the inhomogeneities are compensated for with a system, with a magnetic resonance apparatus, with a computer program product, and with an electronically readable data carrier.

In one context, a method compensates for inhomogeneities in a magnetic field generated by a magnetic resonance apparatus via a shim coil. The method includes arranging the local shim coil on an object under investigation. In this act, the shim coil is arranged in relation (e.g., in a spatial relation) to the object under investigation. The position and orientation of the shim coil are determined automatically. In this act, the position and orientation of the shim coil are automatically determined in relation to the position and orientation of the magnetic resonance apparatus. The inhomogeneities of the magnetic field are determined. For example, the inhomogeneities of the magnetic field are determined in this act with the aid of the magnetic resonance apparatus. The inhomogeneities are compensated for with the aid of the shim coil, depending on the previously determined position and orientation of the shim coil.

Because the shim coil may be moved relative to the object under investigation, the shim coil may be moved, for example, together with a local coil (for example, a receiver coil or a transmitter/receiver coil). In this way, the shim coil may be arranged close to the patient and at the site of an inhomogeneity, via which the shim coil is operated with almost maximum efficiency (e.g., with little electric current for the magnetic field to be generated by the shim coil). Using the knowledge of the precise position and orientation of the local shim coil, the shim currents for the local shim coil, and also the shim currents for the global shim coils, may be determined in an optimum manner in order to compensate for the inhomogeneities of the magnetic field in an optimum manner.

The position of the local shim coil specifies the placement of the local shim coil in all three spatial directions (x, y, z). The orientation of the shim coil specifies the tilt angle of the shim coil in all three directions.

The act of automatically determining the position and orientation of the shim coil includes, for example, an automatic communication of the position and the orientation of the shim coil to the magnetic resonance apparatus. The communication of the position and orientation of the shim coil may be implemented with the aid of an "interrupt message" and/or based on a coil code.

In this context, the interrupt message is a message communicated in the form of an interrupt to the magnetic resonance apparatus. An item of information from which the current position and the current orientation of the shim coil may be derived is a component of the interrupt message. With the "coil code", data that is normally coil-specific, for example, the coil type (e.g., head coil, whole body coil, spine coil), the serial number, the manufacturer, etc. of a coil is encoded. According to one aspect, the coil-specific properties encoded with the coil code are extended with the information from which the position and orientation of the shim coil may be derived. Both the interrupt message and the coil code may derive from a local coil in which the shim coil is arranged or from a system that includes a local coil and a shim coil.

According to one embodiment, only a finite number of combinations of a possible position and a possible orientation of the shim coil exist. For each of these combinations, information exists regarding the form in which the magnetic field changes depending on a current flowing through the shim coil. In that case, it is assumed that the shim coil is disposed at the position corresponding to the combination and with which the orientation corresponding to the combination is aligned. The compensation for inhomogeneities is implemented depending on the information known for the current combination of position and orientation of the shim coil, e.g., the information known for the current position and orientation of the shim coil.

In a number of combinations, the information regarding how the magnetic field changes depending on the current flowing through the shim coil may be determined in advance for each combination.

In accordance with one embodiment, for a pre-defined position and for a pre-defined orientation of the shim coil, a pre-defined item of information is determined in advance by measuring the magnetic field, which indicates how the magnetic field changes depending on a current flowing through the shim coil, in which it is assumed that the shim coil is disposed at the pre-defined position and has the pre-defined orientation. For the automatically determined current position and the automatically determined current orientation of the shim coil, proceeding from the pre-defined information, information is calculated that indicates how the magnetic field changes depending on a current flowing through the shim coil, in which it is assumed that the shim coil is disposed at the automatically determined position and has the automatically determined orientation. The act of compensating for the inhomogeneities is carried out depending on the calculated information.

For example, the magnetic field measured for a respective tilt angle may be computationally rotated depending on the current tilt angle in order to determine the calculated information for the current tilt angle.

In this embodiment, a plurality of pre-defined items of information may be determined in advance by measuring the magnetic field for different combinations of the position and orientation of the shim coil. The usefulness of this embodiment is that the shim coil may be arranged at any desired positions and may have any desired orientations.

In one context, a method for compensating for inhomogeneities in a magnetic field generated by the magnetic resonance apparatus via a shim coil includes determining the inhomogeneities of the magnetic field. This act may be implemented, for example, with the aid of the magnetic resonance apparatus. The method includes determining an optimum position and an optimum orientation of the shim coil so that, with the shim coil disposed at the optimum position and at the optimum orientation, the inhomogeneities of the magnetic field may be compensated for as optimally as possible. An optimum position and an optimum orientation of the shim coil are a position and an orientation of the shim coil that are more suitable than other positions or other orientations of the shim coil for compensating for the inhomogeneities of the magnetic field via the shim coil, which is disposed at the optimum position and is aligned in the optimum orientation.

In the above-described method, the shim coil is arranged in an arbitrary position and in an arbitrary orientation and the shim coil is then used to compensate for inhomogeneities in the magnetic field. In the further method, the position and orientation of the shim coil are determined such that the inhomogeneities of the magnetic field may be optimally compensated for with the shim coil.

According to one embodiment, only a set of combinations exist, in which each combination defines a position and an orientation of the shim coil. For each of the combinations, information exists that indicates how the magnetic field changes depending on a current flowing through the shim coil. The shim coil is disposed at the position corresponding to the respective combination and in which the orientation corresponding to the respective combination is aligned. For the determination of the optimum positions and the optimum orientation, the combination is then determined, the position and orientation of which are best suited for compensating with the shim coil at this position and this orientation for the inhomogeneities of the magnetic field.

In this embodiment, therefore, only the best combination from a fixed set of combinations is determined, such that the determination of the optimum position and the optimum orientation is simplified.

In accordance with one embodiment, for one or more combinations in which each combination defines a position and an orientation of the shim coil, a pre-defined item of information is determined in each case via a measurement of the magnetic field. The predetermined information indicates how the magnetic field changes depending on a current flowing through the shim coil. The shim coil is disposed at the position, and has the orientation, which corresponds to the respective combination. The determination of the optimum position and the optimum orientation of the shim coil is then implemented depending on the pre-defined item(s) of information in that, starting from the pre-defined item(s) of information, the optimum position and the optimum orientation of the shim coil are calculated.

In comparison with the above-described embodiment, the determination of the optimum position and the optimum orientation of the shim coil id, but the best position and orientation may nevertheless be determined, because the further embodiment is not restricted to a finite number of combinations for the position and orientation of the shim coil.

In one context, a system for a magnetic resonance apparatus is also provided. The system includes a local coil, a local shim coil and a device with which the system may be firmly coupled to the magnetic resonance apparatus. The system is configured such that a positional and orientational relationship between the local coil and/or the shim coil on one side and the device on the other side is adjustable.

The following three variants are available for the system. The positional and orientational relationship between the local coil and the device may be changed, where the shim coil is fixedly coupled to the device. The positional and orientational relationship between the shim coil and the device may be changed, whereas the local coil is fixedly coupled to the device. The positional and orientational relationship of both the shim coil and the local coil to the device may be adjusted. In this variant, the shim coil and the local coil may be fixedly coupled to one another so that the shim coil and the local coil are moved in a similar way relative to the device.

A change in the positional and orientational relationship between the local coil and/or the shim coil on one side and the device on the other side correspond with the local coil and/or the shim coil being displaced, tilted, rotated or otherwise moved relative to the device.

The current positional and orientational relationship between the device and the shim coil may be detected by a magnetic resonance apparatus.

Given knowledge of the position and orientation of the device, via additional knowledge of the current positional and orientational relationship between the shim coil and the device, the current position and the current alignment or orientation of the shim coil may be determined. The knowledge of the current position and the current orientation of the shim coil may be used for compensating for the inhomogeneities of the magnetic field via the shim coil.

The system may be configured such that only a finite number of positional and orientational relationships exist between the local coil and/or the shim coil on one side and the device on the other side. In other words, only a finite number of combinations exist, in which each combination defines a position and an orientation of the local coil and/or of the shim coil relative to the device.

The system may be configured such that the positional and orientational relationship between the local coil and/or the shim coil on one side and the device on the other side is defined only through a tilt angle or a rotation angle, so that through the tilt angle, it is defined by what angle the shim coil and/or the local coil is tilted or rotated relative to the device about a given pivot point.

Both of the aforementioned methods according for compensating for inhomogeneities in the magnetic field may be implemented by a system. Firstly, the position and the orientation of the shim coil may be determined with the system to compensate for inhomogeneities in the magnetic field as well as possible. Secondly, at least in some variants of the system, the shim coil may be brought into a certain position and orientation that are suitable for compensating for the inhomogeneities as well as possible.

Within one context, a magnetic resonance apparatus is also provided for generating a magnetic field and for compensating for inhomogeneities in the magnetic field with a local shim coil of the magnetic resonance apparatus. The magnetic resonance apparatus includes a main field magnet, a gradient field system, at least one RF antenna and a control device for controlling the gradient field system and the at least one RF antenna for receiving measurement signals detected by the RF antenna(e) and for evaluating the measurement signals. The shim coil of the magnetic resonance apparatus is configured to be arranged at the object under investigation in order to determine the position and orientation thereof in relation to the magnetic resonance apparatus and in order to convey information concerning the position and the orientation to the magnetic resonance apparatus. The magnetic resonance apparatus is configured to determine inhomogeneities of the magnetic field and to compensate for these inhomogeneities with the aid of the shim coil, depending on the current position and orientation of the shim coil.

The features of the magnetic resonance apparatus may correspond to the features of the above-described method.

The magnetic resonance apparatus may include one or more switches, such that the position and the orientation of the shim coil may be determined via the switch(es). In this regard, the magnetic resonance apparatus may be configured to arrange the shim coil in a fixed positional and orientational relationship to the remainder of the magnetic resonance apparatus. In this regard, the switch(es) may be actuated depending on the positional and orientational relationship.

If a shim coil is connected to the remainder of the magnetic resonance apparatus (i.e., the magnetic resonance apparatus without the shim coil), one or more switches is/are automatically actuated. Therefore, depending on the switches actuated, the magnetic resonance apparatus knows where and how the shim coil is arranged in relation to the magnetic resonance apparatus. The shim coil may be part of a local coil, in which the switch(es) is/are actuated if the local coil is connected to the magnetic resonance apparatus. If the position of the shim coil within the local coil is known, via the actuated switches, the position and orientation of the shim coil may also be determined.

The magnetic resonance apparatus may also include an angle encoder with which the position and the orientation of the shim coil may be determined. The magnetic resonance apparatus may be configured in order to arrange the shim coil in a fixed positional and orientational relationship to the magnetic resonance apparatus (more precisely than the magnetic resonance apparatus without the shim coil). In this case, the angle encoder detects a tilt angle through which the shim coil is rotated or tilted relative to the magnetic resonance apparatus or relative to a local coil.

Based on the tilt angle, the magnetic resonance apparatus may detect the position and the orientation of the shim coil in order, proceeding therefrom, to compensate for the inhomogeneities of the magnetic field via the shim coil.

Within one context, a further magnetic resonance apparatus is provided for generating a magnetic field and for compensating for inhomogeneities in the magnetic field with a local shim coil of the magnetic resonance apparatus. The further magnetic resonance apparatus also includes a main field magnet, a gradient field system, at least one RF antenna and a control device for controlling the gradient field system and the at least one RF antenna, for receiving measurement signals recorded by the RF antenna(e) and for evaluating the measurement signals. The further magnetic resonance apparatus is configured to determine the inhomogeneities of the magnetic field and to determine an optimum position and an optimum orientation of the shim coil such that the inhomogeneities of the magnetic field may be better compensated for with the shim coil in this optimum position and with this optimum orientation than if the shim coil is disposed at another position or in another orientation.

The features of the magnetic resonance apparatus may correspond to the features of the method described herein.

Also disclosed is a computer program product, in which computer instructions are loaded into or stored on a memory store of a programmable control system or a computer unit of a magnetic resonance apparatus. With this computer program product, all or various of the above-described embodiments of the method may be implemented when the computer program product runs in the control system or the control device of the magnetic resonance apparatus. The computer program product may use instructions, e.g., libraries and auxiliary functions in order to realize the relevant embodiments of the method. The computer program product may implement one of the above-described embodiments of the method. The software may be a source code (e.g., C++ source code) that may be compiled (translated) and bound or interpreted, or is an executable software code that, for execution, is loaded into the corresponding computer unit or control device.

The computer program product may include an electronically readable data carrier, for example, a DVD, a magnetic tape or a USB stick, on which electronically readable control information, e.g., the instructions, is stored. If the control information (instructions) is read from the data storage medium and stored in a control device and/or a computer unit of a magnetic resonance apparatus, all the embodiments of the above-described methods may be implemented.

The disclosed embodiments are suitable for compensating for inhomogeneities in the magnetic field with a local shim coil. However, the disclosed embodiments may be applied to other uses, because the simultaneous use of global and local shim coils is also possible, the global shim coils compensating for the large-volume $B_0$ deviations that are caused by the magnet or the patient, whereas the local shim coils compensate for the spatially concentrated inhomogeneities.

According to one aspect, a system that includes a local coil, a shim coil and a fastening device may be configured such that the local coil is configured movable (e.g., tiltable) in relation to the fastening device. The shim coil may also be integrated into the movable part of the system in which the local coil is disposed. The shim coil is then always carried along with the movable part and thus with the local coil.

The disclosed embodiments may be used for head coils, head/neck coils, breast coils with height adjustment, and body coils, which are arranged on the anterior side, as well as for wrist, shoulder and knee coils. The disclosed embodiments may also be transferred to other coil types that are not completely fastened to the table.

BRIEF DESCRIPTION OF THE DRAWINGS

FIG. 2 shows a system in accordance with one embodiment, in which a shim coil and a local coil may be tilted together relative to a magnetic resonance apparatus.

FIG. 3 shows a system in accordance with one embodiment, in which a local coil may be tilted relative to a shim coil.

DETAILED DESCRIPTION

Figure 1:
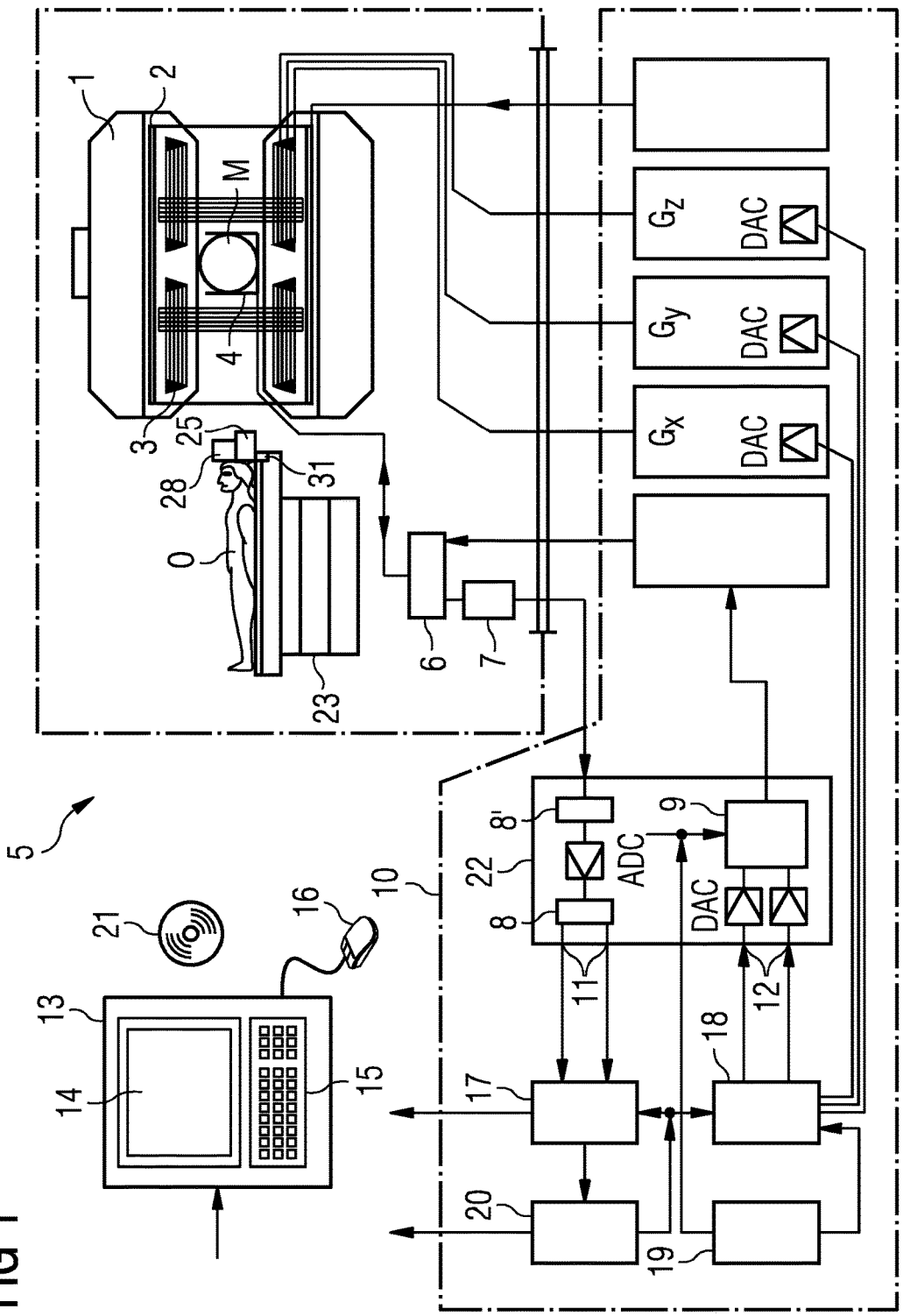
FIG. 1 shows a schematic view of a magnetic resonance apparatus in accordance with one embodiment.

FIG. 1 shows a schematic view of a magnetic resonance apparatus 5 (of a magnetic resonance imaging and/or nuclear spin tomography device). A main field magnet 1 generates a temporally constant strong magnetic field for polarizing and aligning the nuclear spin in a region under investigation of an object O, for example, a part of a human body to be investigated, which lies on a table 23 of the magnetic resonance apparatus 5. The high degree of homogeneity of the main magnetic field involved in nuclear resonance measurements is defined in, for instance, a spherical measurement volume M into which the parts of the human body to be investigated are moved. To support the homogeneity requirements and, to eliminate temporally invariable influences, "shim sheets" made of ferromagnetic material are introduced at suitable sites. Temporally variable influences are eliminated by global shim coils 2 and local shim coils (see FIGS. 2 and 3).

Inserted into the main field magnet 1 is a cylindrical gradient field system or gradient field system 3, which includes three partial windings. Each partial winding is supplied with current from an amplifier to generate a linear (also temporally variable) gradient field in the relevant direction of the Cartesian coordinate system. The first partial winding of the gradient field system 3 generates a gradient $G_x$ in the x-direction, the second partial winding generates a gradient $G_y$ in the y-direction and the third partial winding generates a gradient $G_z$ in the z-direction. The amplifier includes a digital-to-analog converter controlled by a sequence control unit 18 for generating gradient pulses at the right times.

Arranged within the gradient field system 3 is one or more radio-frequency antennae 4 that convert the radio-frequency pulses emitted by a radio-frequency power amplifier into an alternating magnetic field for excitation of the nuclei and alignment of the nuclear spins of the object O under investigation or the region of the object O under investigation. Each radio-frequency antenna 4 includes one or more RF transmitter coils and one or more RF receiver coils in the form of a ring-shaped, linear or matrix-shaped arrangement of component coils. The alternating field emitted by the precessing nuclear spin, e.g., the nuclear spin echo signals evoked by a pulse sequence from one or more radio-frequency pulses and one or more gradient pulses, is also converted by the RF receiving coils of the respective radio-frequency antenna 4 into a voltage (measurement signal), which is fed via an amplifier 7 to a radio-frequency receiving channel 8 of a radio-frequency system 22. The radio-frequency system 22, which is part of a control device 10 of the magnetic resonance apparatus 5, also includes a transmitting channel 9 in which the radio-frequency pulses for exciting the magnetic nuclear resonance are generated. The respective radio-frequency pulses are represented digitally as a sequence of complex numbers based on a pulse sequence in the sequence control unit 18 pre-defined by the system computer 20. This sequence of numbers is fed as a real part and an imaginary part, respectively, via an input 12 to a digital-to-analog converter in the radio-frequency system 22 and are fed from there to a transmitting channel 9. In the transmitting channel 9, the pulse sequences are modulated onto a radio-frequency carrier signal, the basic frequency of which corresponds to the resonance frequency of the nuclear spin in the measurement volume.

The switching over from transmitting to receiving operation is performed via a transmit/receive filter 6. The RF transmitter coils of the radio-frequency antenna(e) 4 radiate the radio-frequency pulses to excite the nuclear spin in the measurement volume M and resulting echo signals are scanned via the RF receiver coil(s). The corresponding nuclear resonance signals obtained are phase-sensitively demodulated in the receiving channel 8' (first demodulator) of the radio-frequency system 22 to an intermediate frequency, digitized in the analog-to-digital converter (ADC) and output via the output 11. This signal is then demodulated to the frequency 0. The demodulation to the frequency 0 and the separation into real and imaginary parts occurs, following digitizing, in the digital domain in a second demodulator 8. Via an image computer 17, an MR image is reconstructed from the measurement data obtained via an output 11. The administration of the measurement data, the image data and the control programs is implemented by the system computer 20. Due to a specification with control programs, the sequence control unit 18 controls the creation of the respectively desired pulse sequences and the corresponding scanning of the k-space. The sequence control unit 18 may control the timely switching of the gradients, the emission of the radio-frequency pulses at a defined phase amplitude and the reception of the nuclear resonance signals. The time basis for the radio-frequency system 22 and the sequence control unit 18 is made available by a synthesizer 19. The selection of corresponding control programs for generating an MR image, which are stored, for example, on a DVD 21, and the representation of the generated MR image are implemented via a terminal 13, which includes a keyboard 15, a mouse 16 and a screen 14.

At the head of the object O under investigation is a head coil that includes a local coil 25 and a shim coil 28. When the system of the head coil is fastened on the table 23, a switch 31 of the magnetic resonance apparatus 5 is actuated. Via the actuation of the switch 31, the magnetic resonance apparatus records the position of the system and thus the position of the shim coil 28. For reasons of patient comfort, the system of a head/neck coil may be tiltable in order to be better able, for example, to position patients with a curved spine.

FIG. 2 shows a system 30 firmly arranged on a table 23 of a magnetic resonance apparatus 5. The system 30 includes a lower shell 26, an upper shell 27, a local coil 25 and a shim coil 28. The local coil 25 and the shim coil 28 are disposed locally fixed within the upper shell 27 so that, in this embodiment, the spatial relationship between the local coil 25 and the shim coil 28 cannot change. The reference sign 29 denotes reception (RX) elements and/or reception/transmission (RX/TX) elements of the local coil 25. The upper shell 27 may be tilted about a pivot point 24 relative to the lower shell 26 by an angle α. Because the upper shell 27 is tilted by an angle α relative to the lower shell 26, the position and the orientation of the shim coil 28 also changes relative to the magnetic resonance apparatus 5.

The magnetic resonance apparatus 5 detects, via a switch (not shown in FIG. 2), at which position the lower shell 26 is connected to the table 23 (e.g., to the magnetic resonance apparatus 5). Via the angle α, which is communicated to the magnetic resonance apparatus 5 by the system 30, for example, via a coil code, the magnetic resonance apparatus 5 may calculate the exact position and the exact orientation of the shim coil 28 relative to the magnetic resonance apparatus 5.

FIG. 3 shows a further system 30. In this system 30, the shim coil 28 is firmly attached to the lower shell 26. Therefore, when the upper shell 27' is tilted about the pivot point 24, only the position and the orientation of the local coil 25 changes, whilst the position and orientation of the shim coil 28 remain constant relative to the lower shell 26 and thus relative to the magnetic resonance apparatus 5. In this embodiment, knowledge of the position of the lower shell 26, which is detected, for example, via a switch, is sufficient for the magnetic resonance apparatus 5 also to determine the position and the orientation of the shim coil 28.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for compensating for inhomogeneities in a magnetic field generated by a magnetic resonance apparatus with a local shim coil, the method comprising:
    arranging the local shim coil at an object under investigation;
    changing a positional, orientational, or positional and orientational relationship between a local coil, the local shim coil, or both the local coil and the local shim coil and a device, the device being a portion or lower shell of a housing of the local coil, wherein the device is configured to be firmly mounted on the magnetic resonance apparatus;
    automatically determining a changed position, a changed orientation, or a changed position and a changed orientation of the local shim coil with respect to the device based on the changed positional, changed orientational, or changed positional and changed orientational relationship between the local coil, the local shim coil, or both the local coil and the local shim coil and the device;
    determining the inhomogeneities of the magnetic field; and
    compensating for the inhomogeneities via the local shim coil depending on the changed position, the changed orientation, or the changed position and the changed orientation of the local shim coil.

2. The method of claim 1, wherein automatically determining the changed position, the changed orientation, or the changed position and the changed orientation of the local shim coil comprises automatically communicating the changed position, the changed orientation, or the changed position and the changed orientation of the local shim coil to the magnetic resonance apparatus.

3. The method of claim 2, wherein automatically communicating the changed position, the changed orientation, or the changed position and the changed orientation is implemented via an interrupt message, a coil code, or both the interrupted message and the coil code.

4. The method of claim 1, wherein:
    a finite number of combinations of the changed position, the changed orientation, or the changed position and the changed orientation of the local shim coil are provided;
    for each combination of the finite number of combinations, an item of information exists regarding how the magnetic field changes depending on a current flowing through the local shim coil; and
    compensating for the inhomogeneities is implemented depending on the item of information corresponding with the determined changed position, changed orientation, or changed position and changed orientation of the local shim coil.

5. The method of claim 1, further comprising:
    determining, for a respective changed position or for a respective changed orientation of the local shim coil, a respective item of information by measuring the magnetic field as to how the magnetic field changes depending on a current flowing through the local shim coil;
    calculating, based on the determined information for the automatically determined changed position or changed orientation of the local shim coil, an item of information as to how the magnetic field changes depending on a current flowing through the local shim coil; and
    compensating for the inhomogeneities is implemented depending on the calculated information.

6. A method for compensating for inhomogeneities in a magnetic field generated by a magnetic resonance apparatus, with a local shim coil, the method comprising:
    changing a positional, orientational, or positional and orientational relationship between a local coil, the local shim coil, or both the local coil and the local shim coil and a device, the device being a portion or lower shell of a housing of the local coil, wherein the device is configured to be firmly mounted on the magnetic resonance apparatus;
    determining the inhomogeneities of the magnetic field; and
    determining an optimum position and an optimum orientation of the local shim coil in order to compensate for the inhomogeneities of the magnetic field with the local shim coil in the optimum position and with the optimum orientation in a manner better than if the local shim coil is disposed at another position or in another orientation with respect to the device.

7. The method of claim 6, wherein:
a finite set of combinations of position and orientation of the local shim coil exists;
for each combination of the finite set of combinations, information exists as to how the magnetic field changes depending on a current flowing through the local shim coil; and
determining the optimum position and the optimum orientation comprises determining the optimum position and the optimum orientation within the set of combinations.

8. The method of claim 6, further comprising:
determining, for at least one combination of a respective position and a respective orientation of the local shim coil, at least one item of information by measuring the magnetic field as to how the magnetic field changes depending on a current flowing through the local shim coil;

wherein determining the optimum position and the optimum orientation of the local shim coil comprises calculating the optimum position and the optimum orientation of the local shim coil starting from the at least one determined item of information.

9. A system for a magnetic resonance apparatus, the system comprising:
a local coil;
a local shim coil; and
a device;
wherein:
the device is a portion or lower shell of a housing of the local coil, and wherein the device is configured to be firmly mounted on the magnetic resonance apparatus; and
the system is configured to:
arrange the local shim coil at an object under investigation;
change a positional, orientational, or positional and orientational relationship between the local coil, the local shim coil, or both the local coil and the local shim coil and the device;
automatically determine a changed position, a changed orientation, or a changed position and a changed orientation of the local shim coil based on the changed positional, changed orientational, or changed positional and changed orientational relationship between the local coil, the local shim coil, or both the local coil and the local shim coil and the device;
determine inhomogeneities of the magnetic field; and
compensate for the inhomogeneities of the magnetic field via the local shim coil depending on the changed positional, the changed orientational, or the changed positional and the changed orientational relationship between the local coil, the local shim coil, or both the local coil and the local shim coil and the device.

10. The system of claim 9, wherein the changed positional and changed orientational relationship between the local shim coil and the device is detectable by the magnetic resonance apparatus.

11. The system of claim 9, wherein a finite number of changed positional and changed orientational relationships exist between the local coil, the local shim coil, or both the local coil and the local shim coil.

12. The system of claim 9, wherein the system is configured such that the changed positional, the changed orientational, or the changed positional and the changed orientational relationship is defined only by a tilt angle through which the local coil, the local shim coil, or both the local coil and the local shim coil is tiltable relative to the device.

13. A magnetic resonance apparatus for generating a magnetic field and for compensating for inhomogeneities in the magnetic field with a local shim coil of the magnetic resonance apparatus, the magnetic resonance apparatus comprising:
a main field magnet;
a gradient field system;
at least one RF antenna; and
a control device configured to control the gradient field system and the at least one RF antenna, and further configured to receive measurement signals of an object under investigation detected by the at least one RF antenna, and further configured to evaluate the measurement signals;
wherein:
the local shim coil is configured to be disposed at the object under investigation to determine a position and an orientation of the local shim coil and to communicate an item of information concerning the position and the orientation of the local shim coil to the magnetic resonance apparatus, wherein a positional and orientational relationship between a local coil, the local shim coil, or both the local coil and the local shim coil and a device is changed, the device being a portion or lower shell of a housing of the local coil; and
the magnetic resonance apparatus is configured to determine inhomogeneities in the magnetic field and to compensate for the inhomogeneities via the local shim coil depending on the position and the orientation of the local shim coil relative to the device.

14. The magnetic resonance apparatus of claim 13, further comprising at least one switch, via which the position and the orientation of the local shim coil is determinable, wherein:
the magnetic resonance apparatus is configured to arrange the local shim coil in a fixed positional and orientational relationship to a remainder of the magnetic resonance apparatus; and
the at least one switch is actuated depending on the positional and orientational relationship.

15. The magnetic resonance apparatus of claim 13, further comprising an angle encoder, via which the position and the orientation of the local shim coil is determinable, wherein:
the magnetic resonance apparatus is configured to arrange the local shim coil in a fixed positional and orientational relationship to a remainder of the magnetic resonance apparatus; and
the angle encoder detects a tilt angle between the local shim coil and the remainder of the magnetic resonance apparatus.

16. A magnetic resonance apparatus for generating a magnetic field and for compensating for inhomogeneities in the magnetic field with a local shim coil of the magnetic resonance apparatus, the magnetic resonance apparatus comprising:
a main magnet;
a gradient field system;
at least one RF antenna; and
a control device configured to control the gradient field system and the at least one RF antenna, and further configured to receive measurement signals of an object under investigation detected by the at least one RF antenna, and further configured to evaluate the measurement signals;
wherein:
the magnetic resonance apparatus is configured to arrange the local shim coil at an object under investigation, determine the inhomogeneities of the magnetic field, change a positional, orientational, or positional and orientational relationship between a local coil, the local shim coil, or both the local coil and the local shim coil and a device, the device being a portion or lower shell of a housing of the local coil, automatically determine an optimum position and an optimum orientation of the local shim coil relative to the device, and compensate for the inhomogeneities of the magnetic field with the local shim coil depending on the changed positional, changed orientational, or changed positional and changed orientational relationship, wherein the compensation for the inhomogeneities of the magnetic field with the local shim coil in the optimum position and with the optimum orientation is performed in a manner better than if the local shim coil is disposed at another position or in another orientation relative to the device.

17. The magnetic resonance apparatus of claim 16, further comprising a system, the system comprising:
the local coil;
the local shim coil; and
the device;
wherein the device is configured to be firmly mounted on the magnetic resonance apparatus.

18. A non-transitory computer-readable storage medium that stores instructions executable by a programmable control system of a magnetic resonance apparatus to compensate for inhomogeneities in a magnetic field with a local shim coil of the magnetic resonance apparatus, the instructions comprising:
arranging the local shim coil at an object under investigation;
changing a positional, orientational, or positional and orientational relationship between a local coil, the local shim coil, or both the local coil and the local shim coil and a device, the device being a portion or lower shell of a housing of the local coil;
automatically determining a changed position, a changed orientation, or a changed position and a changed orientation of the local shim coil relative to the device based on the changed positional, changed orientational, or changed positional and changed orientational relationship between the local coil, the local shim coil, or both the local coil and the local shim coil and the device;
determining the inhomogeneities of the magnetic field; and
compensating for the inhomogeneities via the local shim coil depending on the changed position, the changed orientation, or the changed position and the changed orientation of the local shim coil.

* * * * *